(12) United States Patent
Cui et al.

(10) Patent No.: US 10,396,795 B1
(45) Date of Patent: Aug. 27, 2019

(54) BOOSTED HIGH-SPEED LEVEL SHIFTER

(71) Applicant: Micron Technology, Inc., Boise, ID (US)

(72) Inventors: Mingdong Cui, Folsom, CA (US); Hari Giduturi, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/926,548

(22) Filed: Mar. 20, 2018

(51) Int. Cl.
*H03K 19/0185* (2006.01)
*H03K 17/10* (2006.01)
*H03K 5/003* (2006.01)
*H03K 5/00* (2006.01)

(52) U.S. Cl.
CPC ..... *H03K 19/018528* (2013.01); *H03K 5/003* (2013.01); *H03K 17/102* (2013.01); *H03K 2005/00234* (2013.01)

(58) Field of Classification Search
CPC ............... H03K 5/003; H03K 17/102; H03K 19/018528; H03K 2005/00234
See application file for complete search history.

(56) References Cited

U.S. PATENT DOCUMENTS

| | | | | |
|---|---|---|---|---|
| 6,667,648 B2 * | 12/2003 | Stout | ............ | H03K 19/018521 327/333 |
| 6,842,043 B1 * | 1/2005 | Nguyen | ........... | H03K 3/356113 326/68 |
| 7,274,209 B1 * | 9/2007 | Reinschmidt | .... | H03K 3/356121 326/38 |
| 8,816,749 B2 * | 8/2014 | Alessandro | ........ | H03K 19/0175 326/62 |
| 8,890,789 B2 * | 11/2014 | Tsuchi | ............ | H03K 3/356165 345/100 |
| 9,385,723 B1 * | 7/2016 | Zhao | ................ | H03K 19/00315 |
| 2012/0056656 A1 * | 3/2012 | Chen | .................. | H03K 3/35613 327/333 |
| 2014/0320168 A1 * | 10/2014 | Luo | .................... | H03K 19/0013 326/80 |

OTHER PUBLICATIONS

Liu, et al., "A Novel High-Speed and Low-Power Negative Voltage Level Shifter for Low Voltage Applications", Proceedings of 2010 IEEE International Symposium on Circuits and Systems (ISCAS), May 30-Jun. 2, 2010, IEEE., 4 pgs.

Ying, et al., "An Improved Negative Level Shifter for High Speed and Low Power Applications", 10th IEEE International Conference on Solid-State and Integrated Circuit Technology (ICSICT), Nov. 1-4, 2010, IEEE, 3pgs.

* cited by examiner

*Primary Examiner* — Alexander H Taningco
*Assistant Examiner* — Kurtis R Bahr
(74) *Attorney, Agent, or Firm* — Holland & Hart LLP

(57) ABSTRACT

Methods, systems, and devices for shifting voltage levels of electrical signals and more specifically for boosted high-speed level shifting are described. A boosted level shifter may include a driver circuit that generates a drive signal having a greater voltage swing than an input signal, and the drive signal may drive the gate of a pull-up transistor within the boosted level shifter. The lower bound of the drive signal may in some cases be a negative voltage. Driving the pull-up transistor with a drive signal having a greater voltage swing than the input signal may improve the operational speed and current-sourcing capability of the pull-up transistor, which may provide speed and efficiency benefits.

19 Claims, 6 Drawing Sheets

BOOSTED HIGH-SPEED LEVEL SHIFTER

BACKGROUND

The following relates generally to shifting voltage levels of electrical signals and more specifically to a boosted high-speed level shifter.

In some electrical devices (e.g., digital devices), different voltage levels may represent different logic values. For example, in a binary device, a relatively high voltage level may represent a logic "1," and a relatively low voltage may represent a logic "0." The nominal voltage levels that represent different logic states may vary from device to device. For example, in some devices, a nominal voltage of 0V may represent a logic "0," while in other devices a nominal voltage of −4.5V may represent a logic "0." Similarly, different aspects (e.g., components) of a single device may utilize different nominal voltage levels to represent logic values—that is, a nominal voltage of 0V may represent a logic "0" in one aspect of a device while a nominal voltage of −1.2V may represent a logic "0" in another aspect of the multi-level device. These voltage levels are merely exemplary, and other nominal voltage levels are possible, as are non-binary devices or components in which more than two logic values are possible.

In some cases, a memory device may be (or may be included in) a system in which the nominal voltage level that represents a logic state is inconsistent. Memory devices are widely used to store information in various electronic devices such as computers, wireless communication devices, cameras, digital displays, and the like. Information is stored by programming different logic states of a memory device. For example, binary memory devices have two states, often denoted as logic "1" or logic "0." In some memory devices, more than two states may be stored. To access the stored information, a component of the electronic device may read, or sense, the stored state in the memory device. To store information, a component of the electronic device may write, or program, the state in the memory device.

Improved solutions for shifting voltage levels of electrical signals, including within memory devices or other types of electronic devices and systems, are desired.

DETAILED DESCRIPTION

Figure 1:
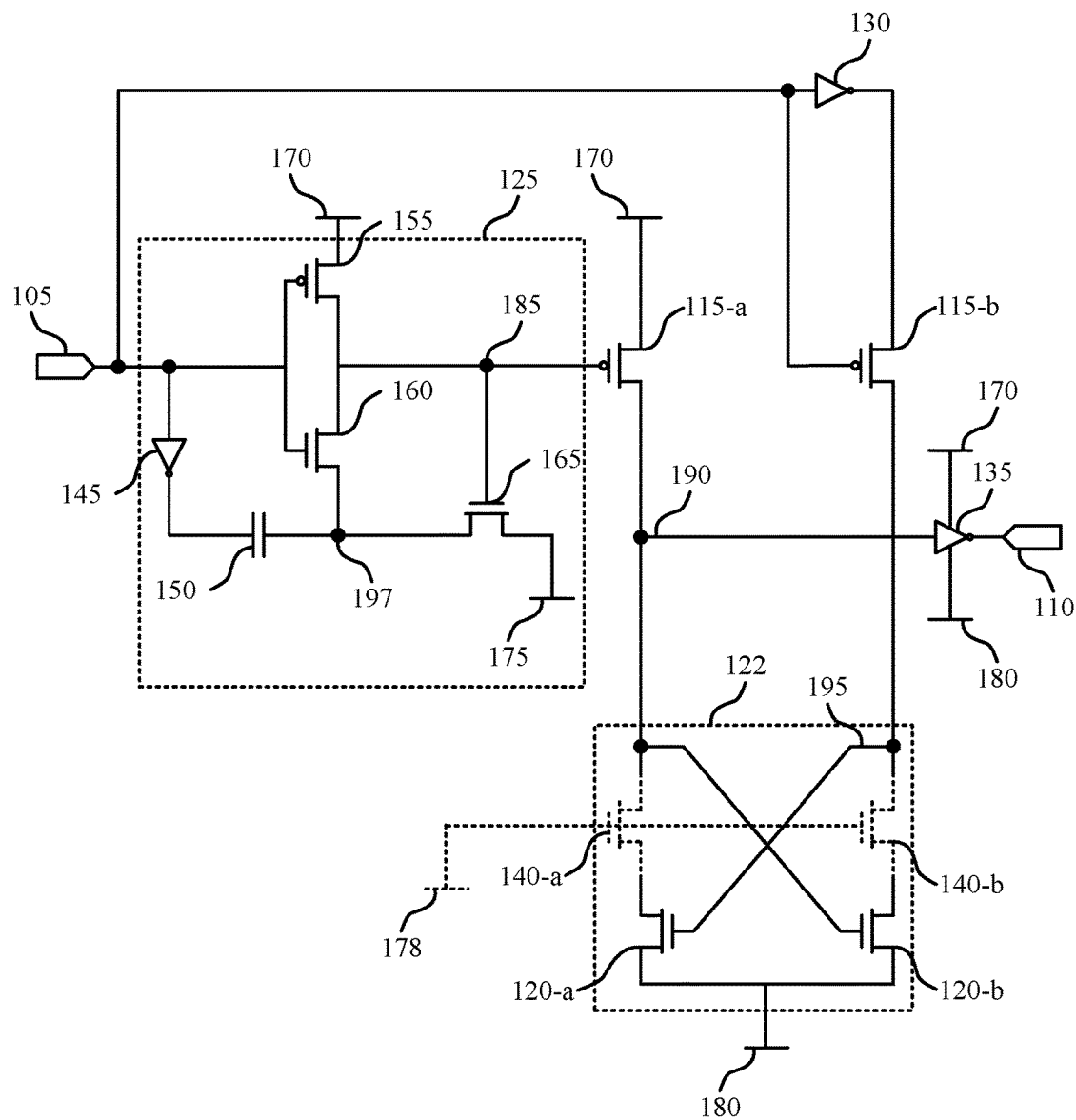
FIG. 1 illustrates an example of a single-sided boosted high-speed level shifter in accordance with embodiments of the present disclosure.

A level shifter, which may be a device configured to shift nominal voltage levels of an electrical signal (e.g., of a digital signal), may include a pull-up transistor coupled with a cross-coupled transistor pair. Upon a rising or falling edge of an input signal, the pull-up transistor may switch the state of the cross-coupled transistor pair, switching one of the cross-coupled transistors from an ON state (e.g., a low-resistance, or saturation state) to an OFF state (e.g., a high-resistance, or cut-off state) and the other of the cross-coupled transistors from an OFF state to an ON state.

To switch the state of the cross-coupled transistor pair, the pull-up transistor may require a certain amount of current-sourcing capability (e.g., sufficient to overpower at least the cross-coupled transistor initially in an ON state). As described in the present disclosure, a boosted high-speed level shifter may include a driver circuit configured to drive the pull-up transistor using a voltage larger in magnitude than the voltage range of the input signal. This may increase the current-sourcing capability of the pull-up transistor and thereby improve the speed and efficiency with which the pull-up transistor may switch the state of the cross-coupled pair, which may improve the operational speed and efficiency of the level shifter overall.

In some electronic systems or devices, such as memory systems or devices, different voltage levels may be used to represent different logic states. In some cases, a device may be a binary device, and a relatively high voltage may represent a first logic value (e.g., a logic "1") while a relatively low voltage may represent a second logic value (e.g., a logic "0"). Non-binary devices that support more than two logic states are also possible.

The nominal voltage level that represents a logic value may vary (e.g., differ) across devices or across different aspects (e.g., components) of a single device. For example, one aspect of a device may use a positive voltage level (e.g., 1.2V) to represent a logic "1" and a lower voltage level (e.g., ~0V) to represent a logic "0," and another aspect of the device may use the same positive voltage level (e.g., 1.2V) to represent a logic "1" but a negative voltage level (e.g., −4.5V) to represent a logic "0." A system or device in which the nominal voltage level that represents a given logic state varies (e.g., may differ from device to device or component to component) may include one or more level shifters, and a level shifter configured to convert an input signal having only non-negative voltage levels into an output signal having at least one negative voltage level may be referred to as a negative level shifter.

A level shifter may include a first pull-up transistor configured to drive an output signal generated by the level shifter to a high state when an input signal is in a first state (e.g., a high state), which may be configured as part of a serial arrangement with a first pull-down transistor that is included in a cross-coupled transistor pair and configured to drive the output signal low when the input signal is in a second state (e.g., a low state). The input signal may repeatedly transition between states, and when the input signal transitions from the second state to the first state (e.g., during a rising edge of the input signal), the first pull-up transistor and the first pull-down transistor may compete with one another. For example, when the input signal is low, the first pull-down transistor may be in an ON state and the first pull-up transistor may be in an OFF state. When the input signal becomes high, the first pull-down transistor may not switch to an OFF state until the first pull-up transistor is able to drive the gate voltage of the first pull-down transistor to a certain voltage (e.g., a sufficiently high voltage). Thus, with each rising edge, a leakage period may occur during which both the first pull-up transistor and the first pull-down transistor are both ON, and this leakage period may persist until the first pull-up transistor drives the gate voltage of the first pull-down transistor to a sufficiently high voltage.

A similar leakage period may exist during each falling edge, during which a second pull-up transistor (which may be configured to help drive the output signal low when the input signal is high) and a second pull-down transistor (which may be included in the cross-coupled transistor pair and configured to help drive the output signal high when the input signal is low) may compete in similar fashion. During the leakage period, on either a rising or falling edge, a low resistance path may exist between a high voltage source (e.g., positive voltage source) and a low voltage source (e.g., negative voltage source) for the level shifter. Thus, decreasing leakage period duration may beneficially improve the power and energy efficiency of a level shifter.

The ability of a pull-up transistor to drive the gate voltage of a pull-down transistor to a sufficiently high voltage so as to turn OFF the pull-down transistor is proportional to the current sourcing capability of the pull-up transistor, and the current sourcing capability of a transistor is proportional to the physical size (e.g., width to length ratio (W/L)) of the transistor, so increasing the physical size of a pull-down transistor may improve its ability to turn OFF a pull-down transistor. But the parasitic capacitance associated with a transistor is also proportional to the physical size of the transistor, and thus increasing the physical size of the pull-up transistor may in fact increase leakage period duration.

Implementing a level shifter in accordance with the teachings of the present disclosure may beneficially decrease leakage period duration on one or more edges of an input signal by increasing the drive voltage with which a pull-up transistor is placed in an ON state. Drive voltage may, in some examples, refer to the voltage differential between a gate and a source of transistor, while overdrive voltage may, in some examples, refer to the difference between the drive voltage and the threshold voltage of the transistor. For example, a level shifter as described herein may include a driver circuit configured to generate a drive signal for the pull-up transistor that has a voltage swing greater than the voltage swing of the input signal, where voltage swing may, in some examples, refer to the voltage difference between a lower bound and an upper bound of the voltage an electric signal (e.g., the difference between a minimum nominal voltage and a maximum nominal voltage for the electric signal). In some cases, the lower bound of the drive signal may be a negative voltage while the lower bound of the input signal may be a non-negative voltage (e.g., 0V).

The current sourcing capability of a transistor may be proportional to the square of the overdrive voltage for the transistor, so increasing the drive voltage (and thus the overdrive voltage) with which a pull-up transistor in a level shifter is placed in an ON state may improve the ability of the pull-up transistor to drive the gate voltage of a pull-down transistor to a sufficiently high voltage so as to turn OFF the pull-down transistor. Further, increasing the drive voltage of a pull-up transistor in a level shifter may support the use of reduced physical dimensions for the pull-up transistor, thereby reducing capacitance of the pull-up transistor and improving the operational speed and efficiency of the level shifter. Additionally, as the supply voltage of a level shifter decreases (e.g., to 1V or less), the difference between the voltage swing of the input signal (which may be equal in magnitude to the supply voltage) and the threshold voltage (e.g., 0.5V) of a pull-up transistor may decrease, and thus the speed and efficiency benefits of driving the pull-up transistor with a drive signal having a voltage swing greater than the voltage swing of the input signal may be enhanced.

Features of the disclosure introduced above are further described below in the context of the example level shifters of FIG. 1 and FIG. 2. These and other features of the disclosure are further illustrated by and described with reference to the flowcharts of FIG. 3 and FIG. 4 that relate to the operation of a boosted high-speed level shifter.

FIG. 1 illustrates an example of a single-boosted high-speed level shifter 100 in accordance with various embodiments of the present disclosure. The level shifter 100 may include a first pull-up transistor 115-*a*, a second pull-up transistor 115-*b*, a cross-coupled transistor pair 122, a driver circuit 125, a first inverter 130, and a second inverter 135.

The cross-coupled transistor pair 122 may include a first cross-coupled transistor 120-*a* and a second cross-coupled transistor 120-*b*. In some cases, the first cross-coupled transistor 120-*a* may be coupled with a first cascode transistor 140-*a*, and the second cross-coupled transistor 120-*b* may be coupled with a second cascade transistor 140-*b*. In other cases, the first cascode transistor 140-*a* and the second cascade transistor 140-*b* may be omitted.

The driver circuit 125 may include a third inverter 145, a boost capacitor 150, a single pull-up transistor 155, a coupling transistor 160, and a charging transistor 165.

The level shifter 100 may be configured to receive an input signal 105 and to generate an output signal 110. The input signal 105 may have a first voltage swing, and the output signal 110 may have a second voltage swing that is different than the first voltage swing. For example, the input signal 105 may swing from a first lower bound to a first upper bound, and the output signal 110 may swing from a second lower bound to a second upper bound (which may be the same as the first upper bound in some cases), where the second lower bound may be lower than the first lower bound. Unless otherwise noted, description related to an upper bound applies to both the first upper bound and the second upper bound. In some cases, the upper bound (e.g., the first upper bound, the second upper bound, or both) may be a positive voltage (e.g., 1V), the first lower bound may be a ground reference (e.g., 0V), and the second lower bound may be a negative voltage (e.g., −4.5V). In such cases, the level shifter 100 may be a negative level shifter, with the input signal 105 swinging from a non-negative voltage (e.g., 0V, or a positive voltage lower than a positive upper bound) to the positive upper bound, and the output signal 110 swinging from a negative voltage to the positive upper bound.

In some cases, the input signal 105 and the output signal 110 may both be digital signals. The upper bound may represent a first logic value (e.g., a logic "1"). The first lower bound may represent a second logic value (e.g., a logic "0") in one aspect of a device (e.g., a memory device) that includes the level shifter 100, and the second lower bound may represent the second logic value (e.g., a logic "0") in another aspect of the device. Thus, the level shifter 100 may receive a digital input signal 105 that represents two distinct logic values using two corresponding nominal voltage levels and generate a digital output signal 110 that represents the same two logic values but with at least one of the corresponding nominal voltage levels shifted (e.g., the lower bound shifted from 0V for the input signal 105 to a negative voltage for the output signal 110).

In the example level shifter 100 illustrated in FIG. 1, the upper bound may be the voltage corresponding to a voltage source 170, and the first lower bound may be the voltage of voltage source 175. The input signal 105 may thus have a first voltage swing from the nominal voltage of voltage source 175 to the nominal voltage of voltage source 170. In some cases, voltage source 175 may be a ground reference, and the nominal voltage of voltage source 175 may be 0V. In other cases, the nominal voltage of voltage source 175 may be a positive voltage lower than the nominal voltage of voltage source 115. The input signal 105 may have at least two valid states. When in a first state (e.g., a high state), the voltage of the input signal 105 may be at or near (e.g., above some threshold voltage based on) the upper bound (e.g., the voltage of voltage source 170). When in a second state (e.g., a low state), the voltage of the input signal 105 may be at or near (e.g., below some threshold voltage based on) the first lower bound (e.g., the voltage of voltage source 175).

The second lower bound may be the voltage of voltage source 180, which may be a negative voltage, or otherwise a lower voltage than the nominal voltage of voltage source 175. The output signal 110 may thus have a second voltage swing from the nominal voltage of voltage source 180 to the nominal voltage of voltage source 170. The output signal 110 may have at least two valid states. When in a first state (e.g., a high state), the voltage of the output signal 110 may be at or near (e.g., above some threshold voltage based on) the upper bound (e.g., the voltage of voltage source 170). When in a second state (e.g., a low state), the voltage of the output signal 110 may be at or near (e.g., below some threshold voltage based on) the second lower bound (e.g., the voltage of voltage source 180).

The first pull-up transistor 115-*a* may, in some examples, be a PMOS transistor. The gate of the first pull-up transistor 115-*a* may be driven by a drive signal 185. The driver circuit 125, the operation of which is detailed herein, may be configured to generate the drive signal 185 based on the input signal 105. The drive signal 185 may have a third voltage swing that is greater than the first voltage swing— that is, the voltage swing of the drive signal 185 may be larger than the voltage swing of the input signal 105. For example, the upper bound of the drive signal 185 may be the upper bound of the input signal 105 (e.g., may be equal to the nominal voltage of voltage source 170), while the lower bound of the drive signal 185 may be lower than the lower bound of the input signal 105 (e.g., may be lower than the nominal voltage of voltage source 175). In some cases, the lower bound of the drive signal 185 may be a negative voltage, while the lower bound of the input signal 105 (e.g., voltage source 175) may be 0V or some other non-negative voltage in some examples. The source of the first pull-up transistor 115-*a* may be coupled with a voltage source corresponding to the upper bound of the input signal 105— e.g., the source of the first pull-up transistor 115-*a* may be coupled with voltage source 170.

The second pull-up transistor 115-*b* may, in some examples, be a PMOS transistor. In some cases, the second pull-up transistor 115-*b* may be physically identical to the first pull-up transistor 115-*a*. In other cases, the first pull-up transistor 115-*a* may have different physical properties (e.g., dimensions) than the second pull-up transistor 115-*b* such that the first pull-up transistor 115-*a* and the second pull-up transistor 115-*b* may have different operation speeds or current-sourcing capabilities. For example, the first pull-up transistor 115-*a* may be physically smaller than the second pull-up transistor 115-*b* (e.g., a smaller width/length ratio, or a smaller multiplicity factor "m" (where "m" may refer to a number of physically distinct but identical individual transistors that may be arranged in parallel and configured to function as a single transistor) and thus may have decreased parasitic capacitance and enhanced operation speed relative to the second pull-up transistor 115-*b*.

The gate of the second pull-up transistor 115-*b* may be driven by the input signal 105. The source of the second pull-up transistor 115-*b* may be driven by an inverted version of the input signal 105. For example, the first inverter 130 may receive the input signal 105 and output an inverted version of the input signal 105, and the output of the first inverter 130 may be coupled with the source of the second pull-up transistor 115-*b*.

The first pull-up transistor 115-*a* may be configured to drive the output signal 110 when the input signal 105 is in the first (e.g., high) state, and the second pull-up transistor 115-*b* may be configured to drive the output signal 110 when the input signal 105 is in the second (e.g., low) state.

For example, when the input signal 105 is in the first state, the driver circuit 125 may be configured to drive the drive signal 185 to a low value (e.g., a lower bound of the drive signal 185), which may place the first pull-up transistor 115-*a* in an ON state (e.g., a low resistance, or saturation state). Also, when the input signal 105 is in the first state, the gate of the second pull-up transistor 115-*b* may be at a higher voltage than the source of the second pull-up transistor 115-*b* (due to the coupling of the source of the second pull-up transistor 115-*b* with the output of the first inverter 130), which may place the second pull-up transistor 115-*a* in an OFF state (e.g., a high resistance, or cut-off state).

When the first pull-up transistor 115-*a* is in an ON state, the first pull-up transistor 115-*a* may couple node 190 (e.g., the drain of the first pull-up transistor 115-*a*) with voltage source 170. The first pull-up transistor 115-*a* may thereby pull node 190 up to the voltage of voltage source 170 when the input signal 105 is in the first state. In some cases, node 190 may be coupled with the input of the second inverter 135. Thus, when the input signal 105 is in the first state, the first pull-up transistor 115-*a* may drive the output signal 110 to a low state (e.g., the voltage of voltage source 180).

In some cases, the second inverter 135 may be omitted, and the output signal 110 may be the voltage at node 190. In other cases, the input of an additional inverter (not shown in FIG. 1) may be coupled with the output of the second inverter 135, and the output signal 110 may be the output of the additional inverter. When the second inverter 135 is not present, or when the output signal 110 is the output of an additional inverter in series with the second inverter 135, the output signal 110 may be in a high state when the input signal 105 is in a high state and in a low state when the input signal 105 is in a low state.

When the input signal 105 is in the first state and the first pull-up transistor 115-*a* is in an ON state, the second cross-coupled transistor 120-*b* may be in an ON state. For example, the gate of the second cross-coupled transistor 120-*b* may be coupled with node 190, and the source of the second cross-coupled transistor 120-*b* may be coupled with a voltage source corresponding to the lower bound of the output signal 110—e.g., the source of the second cross-coupled transistor 120-*b* may be coupled with voltage source 180 (and thus the cross coupled pair 122 may be coupled with voltage source 180). The second cross-coupled transistor 120-*b* may be an NMOS transistor, and thus, when the first pull-up transistor 115-*a* pulls the voltage at node 190 high, the second cross-coupled transistor 120-*b* may be placed in an ON state.

When in an ON state, the second cross-coupled transistor 120-*b* may couple node 195 with voltage source 180, thereby setting the gate of the first cross-coupled transistor 120-*a* (which may be coupled with node 195) at (or near) the voltage of the source of the first cross-coupled transistor 120-*a* (which may be coupled with voltage source 180) and placing the first cross-coupled transistor 120-*a* in an OFF state. Thus, when the first pull-up transistor 115-*a* is an ON state, the first cross-coupled transistor 120-*a* may be in an OFF state, but not until after a leakage period during which relatively little resistance may exist between voltage source 170 and voltage source 180. The structures and techniques described herein may reduce the leakage period and thereby improve the efficiency of the level shifter 100.

In some cases, the first cascode transistor 140-*a* and the second cascode transistor 140-*b* may be present. In such cases, the source of the first cascode transistor 140-*a* may be coupled with the drain of the first cross-coupled transistor 120-*a*, and the drain of the first cascode transistor 140-*a* may be coupled with node 190 (and thus with the drain of the first pull-up transistor 115-*a*). Similarly, the source of the second cascode transistor 140-*b* may be coupled with the drain of the second cross-coupled transistor 120-*b*, and the drain of the second cascode transistor 140-*b* may be coupled with node 195 (and thus with the drain of the second pull-up transistor 115-*b*).

The first cascode transistor 140-*a* and the second cascode transistor 140-*b* may both be NMOS transistors. The first cascode transistor 140-*a* may be configured to be in an ON state whenever the first cross-coupled transistor 120-*a* is in an ON state, and the second cascode transistor 140-*b* may be configured to be in an ON state whenever the second cross-coupled transistor 120-*b* is in an ON state. For example, the gate of the first cascode transistor 140-*a* and the gate of the second cascode transistor 140-*b* may both be biased by voltage source 178 (e.g., the gate of the first cascode transistor 140-*a* and the gate of the second cascode transistor 140-*b* may both be coupled with voltage source 178), and the voltage of voltage source 178 may be greater than the voltage of voltage source 180. In some cases, the voltage of voltage source 178 may be greater than the voltage of voltage source 180 by an amount (which may, in some cases, be an amount equal to the threshold voltage of the first cascode transistor 140-*a* and the second cascode transistor 140-*b* plus a few hundred millivolts (mV)).

When the input signal 105 transitions from the first state to the second state—that is, when a falling edge of the input signal 105 occurs—the driver circuit 125 may be configured to drive the drive signal 185 to a high value (e.g., the upper bound of the drive signal 185, which may be equal to the upper bound of the input signal 105, as detailed below), which may cause the first pull-up transistor 115-*a* to transition to an OFF state. Also, when the input signal 105 is in the second state, the gate of the second pull-up transistor 115-*b* may be at a lower voltage than the source of the second pull-up transistor 115-*b* (due to the coupling of the source of the second pull-up transistor 115-*b* with the output of the first inverter 130), which may place the second pull-up transistor 115-*a* in an ON state.

When the second pull-up transistor 115-*b* transitions to an ON state, the second pull-up transistor 115-*b* may couple node 195 (e.g., the drain of the second pull-up transistor 115-*b*) with the output of the first inverter 130, which may be at the voltage of the voltage source 170, as the output of the first inverter 130 may be high when the input signal 105 is low. The second pull-up transistor 115-*b* may thereby pull node 195 up to a high voltage (e.g., the voltage of voltage source 170) when the input signal 105 transitions to the second state, which may cause the first cross-coupled transistor 120-*a* to transition to an ON state, and may thereby pull node 190 down to (or near to) the voltage of voltage source 180 (which after a leakage period may place the second cross-coupled transistor 120-*b* in an OFF state).

Thus, the voltage at node 190 may be equal (or nearly equal) to the voltage of voltage source 180 when the input signal 105 is in the second state. As described above, node 190 may be coupled with the input of the second inverter 135, and thus, when the input signal 105 is in the second state, the second pull-up transistor 115-*b* may drive the voltage at node 190 low and thereby drive the output signal 110 to a high state (e.g., the voltage of voltage source 170). As also described above, in some cases, the second inverter 135 may be omitted, or an additional inverter (not shown in FIG. 1) may be coupled in series with the second inverter 135.

The input signal 105 may repeatedly transition from the first state to the second state and from the second state back to the first state any number of times. As described herein, the driver circuit 125 may be configured to drive the drive signal 185 to a high value when the input signal is in the second state (e.g., low) and to drive the drive signal to a low value with the input signal is in the first state (e.g., high). When the drive signal 185 is at the high value (e.g., a voltage at or near the voltage of voltage source 170), the first pull-up transistor 115-*a* may be in an OFF state, as the voltage differential between the source of the first pull-up transistor 115-*a* and the gate of the first pull-up transistor 115-*a* may be small (e.g., may be negligibly small). When the drive signal 185 is at the low value, however, the first pull-up transistor 115-*a* may be in an ON state, as the voltage differential between the source of the first pull-up transistor 115-*a* and the gate of the first pull-up transistor 115-*a* may be large.

In some cases, the driver circuit 125 may be configured to drive the drive signal 185 to a low value (e.g., a lower bound of the drive signal 185) that is below the lower bound of the input signal 105. Thus, the drive signal 185 may have a larger voltage swing than the input signal 105. Increasing the voltage swing of the drive signal 185 relative to the voltage swing of the input signal, including configuring the drive signal 185 to have a lower bound that is below the lower bound of the input signal 105, may increase the drive voltage of the first pull-up transistor 115-*a* (e.g., the voltage differential between the source of the first pull-up transistor 115-*a* and the gate of the first pull-up transistor 115-*a*) when the first pull-up transistor 115-*a* is an ON state.

Increasing the voltage swing of the drive signal 185 relative to the voltage swing of the input signal, including configuring the drive signal 185 to have a lower bound that is below the lower bound of the input signal 105, may beneficially improve the current driving capability of the first pull-up transistor 115-*a* and/or the speed at which the first pull-up transistor 115-*a* transitions to the ON state and the first cross-coupled transistor 120-*a* transitions to an OFF state. This may improve the efficiency (e.g., power and energy efficiency) of the level shifter 100 (e.g., by minimizing the leakage current through the first cross-coupled transistor at each rising edge of input signal 105). Additionally or alternatively, increasing the voltage swing of the drive signal 185 relative to the voltage swing of the input signal, including configuring the drive signal 185 to have a lower bound that is below the lower bound of the input signal 105, may facilitate a reduced physical size of the first pull-up transistor 115-*a*, which may provide layout benefits (e.g., space savings) as well as, by reducing associated parasitic capacitance, further operational speed and thus efficiency benefits. These benefits are merely exemplary, and one of ordinary skill may appreciate further benefits.

Using a single driver circuit 125 to drive one pull-up transistor 115 of a level shifter, as in the example of the single-boosted level shifter 100 illustrated in FIG. 1, may have certain benefits relative to, for example, using two driver circuits 125, one to drive each pull-up transistor of the level shifter. For example, in many systems or devices, operational speed may be more critical at one edge of the input signal 105 than the other (e.g., operational speed at the rising edge may be more critical than at the falling edge, or vice versa). As one example, a memory device may execute a read or a write operation upon either the rising or falling edge of a signal but not upon the other edge. Further a system or device may include multiple level shifters—e.g., a memory device may include a level shifter for each access line (e.g., word or bit line) that the memory device uses for read and write operations. Each driver circuit 125 may consume some amount of space and power, and thus a level shifter with a single driver circuit 125 as in the example of the single-boosted level shifter 100 illustrated in FIG. 1 may provide layout benefits (e.g., space savings) and efficiency benefits (e.g., power consumption by driver circuits) relative to a level shifter with multiple driver circuits 125. These relative benefits are merely exemplary, and one of ordinary skill will appreciate further benefits based on the present disclosure.

In some cases, when the input signal 105 is in one state (e.g., the second state), the driver circuit 125 may be configured to generate a voltage differential across the boost capacitor 150 and to couple the gate of the first pull-up transistor 115-a with a voltage source corresponding to the upper bound of the drive signal 185 (e.g., voltage source 170). When the input signal 105 is in another state (e.g., the first state), the driver circuit 125 may be configured to couple the boost capacitor 150 with the gate of the first pull-up transistor 115-a. When the input signal 105 is the first state, the boost capacitor 150 may maintain the voltage differential generated during the second state, and the driver circuit 125 may be configured to drive the drive signal 185 to a voltage below the lower bound of the input signal 105 based on the voltage differential across the boost capacitor 150. In some cases, the boost capacitor 150 may comprise one or more transistors, and the capacitance of the boost capacitor 150 may be based on a gate capacitance of the one or more transistors. For example, the boost capacitor 150 may comprise some number of parallel transistors, with the sources, drains, and bulks of the parallel transistors coupled with one another to form one terminal of the boost capacitor 150 and the gates of the parallel transistors coupled with one another to form the other terminal of the boost capacitor 150.

For example, the input of the third inverter 145 may be configured to receive the input signal 105, and the output of the third inverter 145 may be coupled with a first side of the boost capacitor 150. When the input signal 105 is in the second state (e.g., a low state), the output of the third inverter 145 may be high (e.g., may be at the upper bound of the input signal 105, which may be the nominal voltage of voltage source 170). The single pull-up transistor 155 may configured to be in an ON state when the input signal is in the second state. For example, the single pull-up transistor 155 may be a PMOS transistor, the source of the single pull-up transistor 155 may be coupled with a voltage source corresponding to the upper bound of the input signal 105 (e.g., voltage source 170), and the gate of the single pull-up transistor 155 may be driven by the input signal 105. Thus, when the input signal is in the second state, a voltage differential may exist between the source and the gate of the single pull-up transistor 155 that places the single pull-up transistor 155 in the ON state.

In some cases, the single pull-up transistor 155 may be configured to have a high voltage tolerance. The single pull-up transistor 155 may have a thicker gate oxide than at least one other transistor within the driver circuit 125 and/or at least one other transistor within the level shifter 100. In some cases, the single pull-up transistor 155 may have a thicker gate oxide than any other transistor within the driver circuit 125 and/or any other transistor within the level shifter 100. The use of a single pull-up transistor 155 (e.g., a single high-voltage pull-up transistor) within the driver circuit 125 may have benefits relative to the use of multiple pull-up transistors or a cascoded arrangement (e.g., a low-voltage pull-up transistor in series with a low voltage cascoded transistor). For example, the use of a single pull-up transistor may provide layout benefits (e.g., space savings) and may improve the speed and current sourcing capability with which pull-up in the driver circuit 125 occurs. For example, a single high-voltage pull-up transistor may have stronger pull-up capability compared to a low-voltage pull-up transistor in series with a low voltage cascoded transistor, which may improve the operation of the driver circuit 125 and thus the level shifter 100 upon a falling edge of the input signal 105.

When the single pull-up transistor 155 is in an ON state, the charging transistor 165 may be configured to also be in an ON state. For example, the charging transistor 165 may be an NMOS transistor, and the gate of the charging transistor 165 may be coupled with the drain of the single pull-up transistor 155, and the source of the charging transistor 165 may be coupled with a voltage source corresponding to a lower bound of the input signal 105 (e.g., voltage source 175). Thus, when the single pull-up transistor 155 is in an ON state, the gate of the charging transistor 165 may be at or near the voltage of the source of the single pull-up transistor 155 (e.g., voltage source 170), while the source of the charging transistor 165 may be at or near the lower bound of the input signal 105 (e.g., voltage source 175), which may place the charging transistor 165 in the ON state.

When the charging transistor 165 is in the ON state, the voltage at node 197 may be at or near the lower bound of the input signal 105 (e.g., voltage source 175) while, as described above, the output of the third inverter 145 may be at or near the upper bound of the input signal 105 (e.g., voltage source 170). Thus, when the input signal 105 is in the second state, the driver circuit 125 may generate a voltage differential across the boost capacitor 150 that is equal or nearly equal to the voltage swing of the input signal (e.g., the different between voltage source 170 and voltage source 175, with node 197 at a lower voltage than the other terminal of the boost capacitor 150.

The coupling transistor 160 may be in an OFF state when the input signal 105 is in the second state. For example, the coupling transistor 160 may be an NMOS transistor, and the gate of the coupling transistor 160 may be driven by the input signal 105, which may be at a voltage at or near the voltage of the source of the coupling transistor 160 (e.g., at or near the voltage of voltage source 175, due to the charging transistor 165 being in an ON state). In some cases, the coupling transistor 160 may be a triple well transistor.

When the input signal 105 transitions to the first state (e.g., a high state), the single pull-up transistor 155 may transition to an OFF state (which may occur more quickly than either the first pull-up transistor 115-a or the second pull-up transistor 115-b may transition states), and the coupling transistor 160 may transition to an ON state. The output of the third inverter 145 may also transition to be low (e.g., to be at or near the lower bound of the input signal 105, which may be the nominal voltage of voltage source 175). The boost capacitor 150 may maintain the voltage differential generated when the input signal 105 was in the second state, and thus when the output of the third inverter 145 transitions to be low, the voltage at node 197 may decrease to a voltage that is nominally (e.g., ignoring leakage effects) equal to the voltage at the output of the third inverter 145 minus the voltage differential that was generated across the boost capacitor 150 when the input signal 105 was in the second state. Thus, for example, when the input signal 105 is in the first state, the voltage at node 197 may nominally be equal to the lower bound of the input signal 105 (e.g., the voltage of voltage source 175) minus the voltage swing of the input signal 105 (e.g., the voltage of voltage source 170 minus the voltage of voltage source 175). In some cases, the voltage of voltage source 175 may be 0V, the voltage of voltage source 170 may be referred to as Vcc, and thus when the input signal 105 is in the first state, the voltage at node 197 may nominally be equal to −Vcc (0V minus Vcc), though the actual voltage at node 197 may in some cases be nearer the voltage of voltage source 175 (e.g., nearer to 0V) due to charge sharing between the boost capacitor 150 and other parasitic capacitances (e.g., the gate capacitance of the first pull-up transistor 115-a). Even though the voltage at node 197 may deteriorate over time (e.g., the voltage differential across the boost capacitor 150 may decrease over time due to leakage, such as subthreshold leakage associated with the single pull-up transistor 155 or source-substrate junction leakage associated with of the charging transistor 165), the state of the level shifter 100 and thus of the output signal 110 may have already switched and thus may be maintained thereafter, until the next transition of the input signal 105.

Because the coupling transistor 160 may be in an ON state when the input signal 105 is in the first state, the coupling transistor 160 may couple node 197 to the gate of the first pull-up transistor 115-a when the input signal 105 is in the first state. Thus, the driver circuit 125 may drive the drive signal 185 to a value lower than the lower bound of the input signal 105 (e.g., a negative voltage, such as −Vcc) when the input signal 105 is in the first state, which may be beneficial for the reasons described herein as well as other reasons that may be appreciated by one of skill in the art.

Further, because the drive signal 185 may have a voltage lower than the lower bound of the input signal 105 when the input signal 105 is in the first state, the gate of the charging transistor 165 may be at or below the voltage of voltage source 175, and thus the charging transistor 165 may be in an OFF state when the input signal 105 is in the first state. This may beneficially avoid leakage associated with the boost capacitor 150 and thus help maintain the voltage differential across the boost capacitor 150 (and thus maintain the drive signal 185 at a voltage lower than the lower bound of the input signal 105) when the input signal 105 is in the first state.

Figure 2:
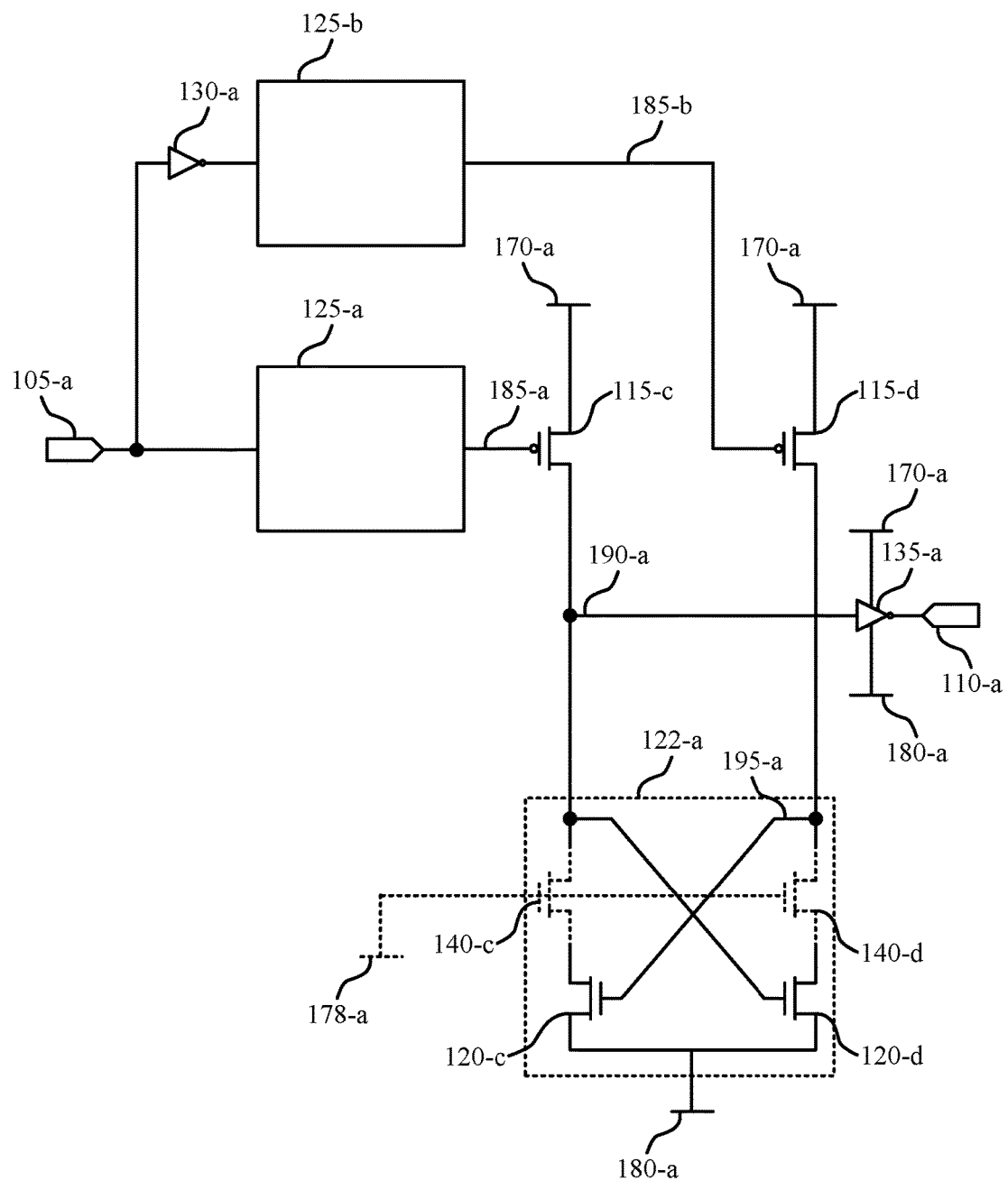
FIG. 2 illustrates an example of a double-sided boosted high-speed level shifter in accordance with embodiments of the present disclosure.

FIG. 2 illustrates an example of a double-boosted high-speed level shifter 200 in accordance with various embodiments of the present disclosure. The level shifter 200 may include a first pull-up transistor 115-c, a second pull-up transistor 115-d, a cross-coupled transistor pair 122-a, a first driver circuit 125-a, a second driver circuit 125-b, a first inverter 130-a, and a second inverter 135-a.

The cross-coupled transistor pair 122-a may include a first cross-coupled transistor 120-c and a second cross-coupled transistor 120-d. In some cases, the first cross-coupled transistor 120-c may be coupled with a first cascode transistor 140-c, and the second cross-coupled transistor 120-d may be coupled with a second cascade transistor 140-d. In other cases, the first cascode transistor 140-a and the second cascade transistor 140-b may be omitted.

The level shifter 200 may be configured to receive an input signal 105-a and to generate an output signal 110. The input signal 105-a may have a first voltage swing, and the output signal 110-a may have a second voltage swing that is different than the first voltage swing. For example, the input signal 105-a may swing from a first lower bound to a first upper bound, and the output signal 110-a may swing from a second lower bound to a second upper bound (which may be the same as the first upper bound in some cases), where the second lower bound is lower than the first lower bound. Unless otherwise noted, description related to an upper bound applies to both the first upper bound and the second upper bound. In some cases, the upper bound (e.g., the first upper bound, the second upper bound, or both) may be a positive voltage (e.g., 1V), the first lower bound may be a ground reference (e.g., 0V), and the second lower bound may be a negative voltage (e.g., −4.5V). In such cases, the level shifter 200 may be a negative level shifter, with the input signal 105-a swinging from a non-negative voltage (e.g., 0V, or a positive voltage lower than a positive upper bound) to the positive upper bound, and the output signal 110-a swinging from a negative voltage to the positive upper bound.

In some cases, the input signal 105-a and the output signal 110-a may both be digital signals. The upper bound may represent a first logic value (e.g., a logic "1"). The first lower bound may represent a second logic value (e.g., a logic "0") in one aspect of a device (e.g., a memory device) that includes the level shifter 200, and the second lower bound may represent the second logic value (e.g., a logic "0") in another aspect of the device. Thus, the level shifter 200 may receive a digital input signal 105-a that represents two distinct logic values using two corresponding nominal voltage levels and generate a digital output signal 110-a that represents the same two logic values but with at least one of the corresponding nominal voltage levels shifted (e.g., the lower bound shifted from 0V for the input signal 105-a to a negative voltage for the output signal 110-a).

In the example level shifter 200 illustrated in FIG. 2, the upper bound may be the voltage corresponding to a voltage source 170-a, and the first lower bound may be the voltage of voltage source 175-a. The input signal 105-a may thus have a first voltage swing from the nominal voltage of voltage source 175-a to the nominal voltage of voltage source 170-a. In some cases, voltage source 175-a may be a ground reference, and the nominal voltage of voltage source 175-a may be 0V. In other cases, the nominal voltage of voltage source 175-a may be a positive voltage lower than the nominal voltage of voltage source 115-a. The input signal 105-a may have at least two valid states. When in a first state (e.g., a high state), the voltage of the input signal 105-a may be at or near (e.g., above some threshold voltage based on) the upper bound (e.g., the voltage of voltage source 170-a). When in a second state (e.g., a low state), the voltage of the input signal 105-a may be at or near (e.g., below some threshold voltage based on) the first lower bound (e.g., the voltage of voltage source 175-a).

The second lower bound may be the voltage of voltage source 180-a, which may be a negative voltage, or otherwise a lower voltage than the nominal voltage of voltage source 175-a. The output signal 110-a may thus have a second voltage swing from the nominal voltage of voltage source 180-a to the nominal voltage of voltage source 170-a. The output signal 110-a may have at least two valid states. When in a first state (e.g., a high state), the voltage of the output signal 110-a may be at or near (e.g., above some threshold voltage based on) the upper bound (e.g., the voltage of voltage source 170-a). When in a second state (e.g., a low state), the voltage of the output signal 110-a may be at or near (e.g., below some threshold voltage based on) the second lower bound (e.g., the voltage of voltage source 180-*a*).

The first pull-up transistor 115-*c*, the cross-coupled pair 122-*a*, the first driver circuit 125-*a*, and the second inverter 135-*a* may be configured and may function as described above in the context of FIG. 1 with reference to the first pull-up transistor 115-*a*, the cross-coupled pair 122, the driver circuit 125, and the second inverter 135, respectively. Thus, the first driver circuit 125-*a* may generate the first drive signal 185-*a* as described in the context of FIG. 1 with reference to the driver circuit 125 and the drive signal 185. For example, the first drive signal 185-*a* may have a voltage swing greater than the voltage swing of the input signal 105-*a*, and the lower bound of the drive signal 185-*a* may be lower than the lower bound of the input signal 105-*a* (e.g., the lower bound of the drive signal 185-*a* may be a negative voltage while the lower bout of the input signal 105-*a* may be a non-negative voltage).

The gate of the second pull-up transistor 115-*d* may, however, be coupled with the second driver circuit 125-*b*, and thus the second pull-up transistor 115-*d* may be driven by the second drive signal 185-*b*. Further, the source of the second pull-up transistor may be coupled with voltage source 170-*a*. The first inverter 130-*a* may receive the input signal 105-*a* and output an inverted version of the input signal 105-*a*, and the output of the first inverter 130 may be coupled with an input of the second driver circuit 125-*b*. The second driver circuit 125-*b* may receive the inverted version of the input signal 105-*a* output by the first inverter 130-*a* and generate the second drive signal 185-*b* as described in the context of FIG. 1 with reference to the driver circuit 125 and the drive signal 185. Thus, the second drive signal 185-*b* may be an inverted version of the first drive signal 185-*a*. The second pull-up transistor 115-*d* may be in an ON state when the second drive signal 185-*b* is low and in an OFF state when the second drive signal 185-*b* is high.

In some cases, using two driver circuits 125 to respectively drive two pull-up transistors 115 of a level shifter, as in the example of the double-boosted level shifter 200 illustrated in FIG. 2, may have benefits such as reducing leaking period duration on both the rising edge and the falling edge of the input signal 105-*a*, but may have drawbacks such as layout drawbacks (e.g., space consumption) and efficiency drawbacks (e.g., increased power consumption by driver circuits 125) relative to, for example, a level shifter with a single driver circuit 125. These relative benefits and drawbacks are merely exemplary, and one of ordinary skill may appreciate further benefits.

Figure 3:
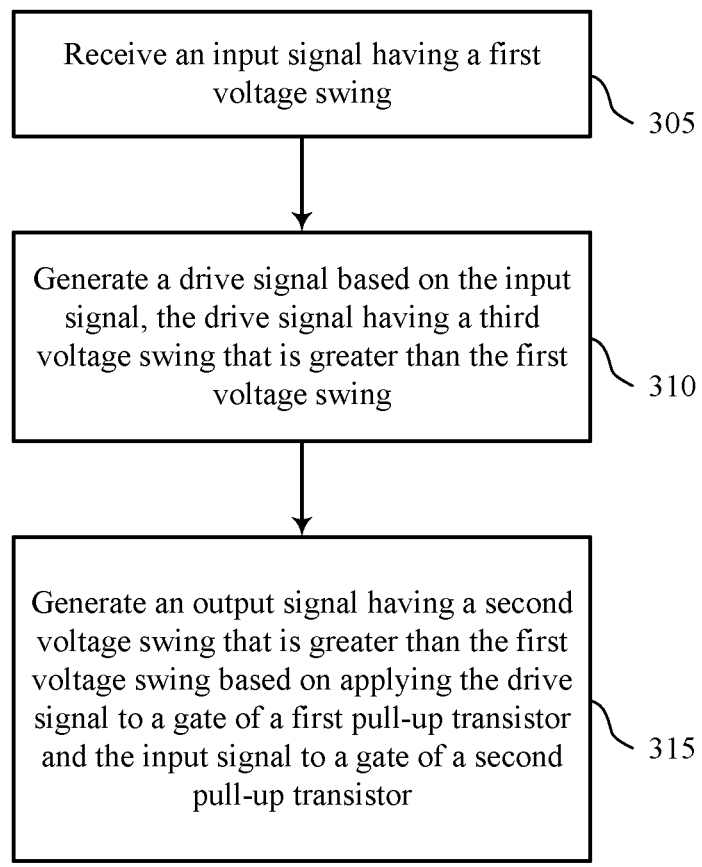
FIGS. 3 through 6 illustrate methods for boosted high-speed level shifting in accordance with embodiments of the present disclosure.

FIG. 3 shows a flowchart illustrating a method 300 for boosted high-speed level shifting in accordance with embodiments of the present disclosure. The operations of method 300 may be implemented by a level shifter 100 or its components as described herein. For example, the operations of method 300 may be performed by a level shifter as described with reference to FIG. 1.

In some cases, the method may include—and an apparatus as described herein may include features, means, or instructions for—receiving an input signal having a first voltage swing, generating a drive signal based at least in part on the input signal, the drive signal having a third voltage swing that is greater than the first voltage swing, and generating an output signal having a second voltage swing that is greater than the first voltage swing based at least in part on applying the drive signal to a gate of a first pull-up transistor and the input signal to a gate of a second pull-up transistor.

In some cases, generating the drive signal may include coupling, when the input signal is in a second state, the gate of the first pull-up transistor to a voltage source corresponding to an upper bound of the first voltage swing via a single pull-up transistor. In some cases, generating the drive signal may include generating a voltage differential across a boost capacitor when the input signal is in a second state. In some cases, the method may also include coupling the boost capacitor with the gate of the first pull-up transistor when the input signal is in a first state.

In some cases, the method may also include generating an inverted version of the input signal. In some cases, the method may also include applying the inverted version of the input signal to a source of the second pull-up transistor, wherein generating the output signal is based at least in part on applying the inverted version of the input signal to the source of the second pull-up transistor.

In some examples, the level shifter may perform aspects of the functions described below using special-purpose hardware. For example, the level shifter may be configured to convert an input signal having a first voltage swing into an output signal having a second voltage swing that is greater than the first voltage swing, and the level shifter may include a driver circuit configured to generate a drive signal based at least in part on the input signal, the drive signal having a third voltage swing that is greater than the first voltage swing, a first pull-up transistor configured to drive the output signal when the input signal is in a first state, wherein the drive signal drives a gate of the first pull-up transistor, and a second pull-up transistor configured to drive the output signal when the input signal is in a second state, wherein the input signal drives a gate of the second pull-up transistor.

In some examples, the level shifter may further include an inverter configured to generate an inverted version of the input signal and drive a source of the second pull-up transistor using the inverted version of the input signal.

In some examples the driver circuit may include a single pull-up transistor configured to couple the gate of the first pull-up transistor to a voltage source corresponding to an upper bound of the first voltage swing when the input signal may be in the second state. In some examples, a source of the single pull-up transistor may be coupled with the voltage source corresponding to the upper bound of the first voltage swing, and a drain of the single pull-up transistor may be coupled with the gate of the first pull-up transistor. In some examples, the drain of the single pull-up transistor may also be coupled with an n-type transistor, which may comprise a triple well transistor. In some examples, the single pull-up transistor may have a first gate oxide thickness, and at least one other transistor within the driver circuit may have a second gate oxide thickness that is less than the first gate oxide thickness.

In some examples, the driver circuit may include a switching network configured to generate a voltage differential across a boost capacitor when the input signal is in the second state and couple the boost capacitor with the gate of the first pull-up transistor when the input signal is in the first state. In some examples, the voltage differential may be based at least in part on the first voltage swing. In some examples, the switching network is further configured to couple the boost capacitor with a voltage source corresponding to a lower bound of the first voltage swing when the input signal is in the second state.

In some examples, the boost capacitor comprises a transistor. In some examples of the undefined described above, a capacitance of the boost capacitor comprises a gate capacitance of the transistor.

In some examples, being in the first state comprises having a voltage above a first threshold voltage, and being in the second state comprises having a voltage below a second threshold voltage. In some examples, the first threshold voltage corresponds to a first logic value, and the second threshold voltage corresponds to a second logic value.

In some examples, the first voltage swing may be from a non-negative voltage to a positive voltage, the second voltage swing may be from a negative voltage to the positive voltage, and the third voltage swing may be from a negative voltage to the positive voltage.

In some examples, a level shifter may be configured to receive an input signal having a first voltage range and generate an output signal having a second voltage range, wherein the first voltage range is from a non-negative lower bound to a positive upper bound and the second voltage range is from a negative lower bound to the positive upper bound, and the level shifter may include a first drive transistor configured to couple a gate of a first pull-up transistor with a boost capacitor when the input signal is in a first state, the first pull-up transistor configured to drive the output signal when the input signal is in the first state, a second drive transistor configured to couple the gate of the first pull-up transistor to a voltage source corresponding to the positive upper bound when the input signal is in a second state, and a second pull-up transistor configured to drive the output signal when the input signal is in the second state, wherein the input signal drives a gate of the second pull-up transistor and an inverted version of the input signal drives a source of the second pull-up transistor.

At 305 the level shifter 100 may receive an input signal having a first voltage swing. The operations of 305 may be performed according to the methods described herein. In certain examples, aspects of the operations of 305 may be performed by a level shifter 100 as described with reference to FIG. 1.

At 310 the level shifter 100 may generate a drive signal based at least in part on the input signal, the drive signal having a third voltage swing that is greater than the first voltage swing. The operations of 310 may be performed according to the methods described herein. In certain examples, aspects of the operations of 310 may be performed by a level shifter 100 as described with reference to FIG. 1, including by a driver circuit 125 as described with reference to FIG. 1.

At 315 the level shifter 100 may generate an output signal having a second voltage swing that is greater than the first voltage swing based at least in part on applying the drive signal to a gate of a first pull-up transistor and the input signal to a gate of a second pull-up transistor. The operations of 315 may be performed according to the methods described herein. In certain examples, aspects of the operations of 315 may be performed a level shifter 100 as described with reference to FIG. 1.

Figure 4:
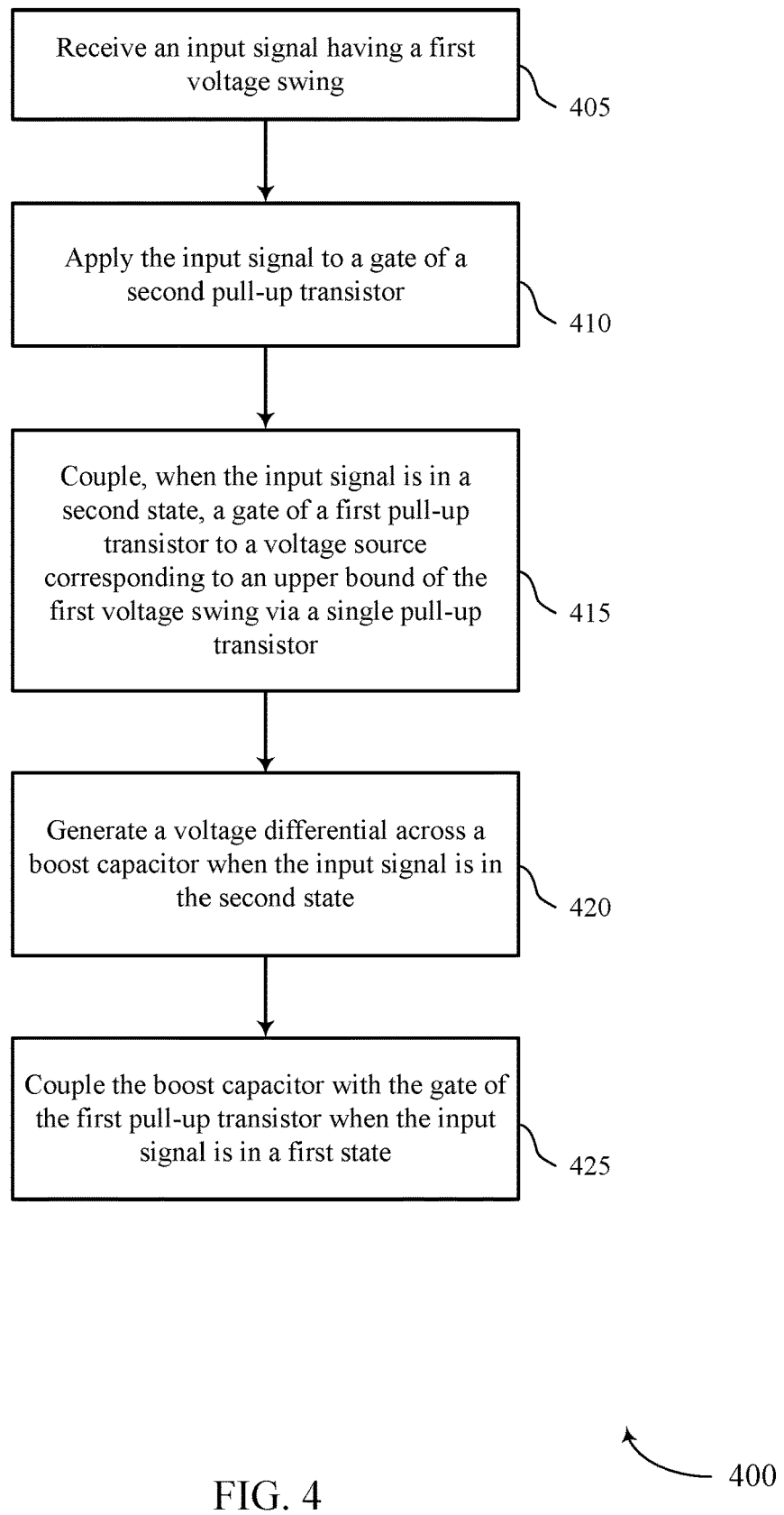

FIG. 4 shows a flowchart illustrating a method 400 for boosted high-speed level shifting in accordance with embodiments of the present disclosure. The operations of method 400 may be implemented by a level shifter 100 or its components as described herein. For example, the operations of method 400 may be performed by a level shifter as described with reference to FIG. 1.

In some cases, the method may also include receiving an input signal having a first voltage swing. In some cases, the method may also include generating a drive signal based at least in part on the input signal, the drive signal having a third voltage swing that is greater than the first voltage swing. In some cases, the method may also include generating an output signal having a second voltage swing that is greater than the first voltage swing based at least in part on applying the drive signal to a gate of a first pull-up transistor and the input signal to a gate of a second pull-up transistor. In some cases, generating the drive signal comprises: generating a voltage differential across a boost capacitor when the input signal is in a second state. In some cases, the method may also include coupling the boost capacitor with the gate of the first pull-up transistor when the input signal is in a first state.

At 405 the level shifter 100 may receive an input signal having a first voltage swing. The operations of 405 may be performed according to the methods described herein. In certain examples, aspects of the operations of 405 may be performed by a level shifter 100 as described with reference to FIG. 1.

At 410 the level shifter 100 may apply the input signal to a gate of a second pull-up transistor. The operations of 410 may be performed according to the methods described herein. In certain examples, aspects of the operations of 410 may be performed by a level shifter 100 as described with reference to FIG. 1.

At 415 the level shifter 100 may couple, when the input signal is in a second state, a gate of a first pull-up transistor to a voltage source corresponding to an upper bound of the first voltage swing via a single pull-up transistor. The operations of 415 may be performed according to the methods described herein. In certain examples, aspects of the operations of 415 may be performed by a level shifter 100 as described with reference to FIG. 1, including by a driver circuit 125 as described with reference to FIG. 1.

At 420 the level shifter 100 may generate a voltage differential across a boost capacitor when the input signal is in the second state. The operations of 420 may be performed according to the methods described herein. In certain examples, aspects of the operations of 420 may be performed by a level shifter 100 as described with reference to FIG. 1, including by a driver circuit 125 as described with reference to FIG. 1.

At 425 the level shifter 100 may couple the boost capacitor with the gate of the first pull-up transistor when the input signal is in a first state. The operations of 425 may be performed according to the methods described herein. In certain examples, aspects of the operations of 425 may be performed by a level shifter 100 as described with reference to FIG. 1, including by a driver circuit 125 as described with reference to FIG. 1.

In some cases, at 415, 420, and 425 collectively, the level shifter may 100 generate a drive signal based at least in part on the input signal, the drive signal having a third voltage swing that is greater than the first voltage swing. The level shifter 100 may generate an output signal having a second voltage swing that is greater than the first voltage swing based on applying the drive signal to a gate of a first pull-up transistor and the input signal to a gate of a second pull-up transistor.

Figure 5:
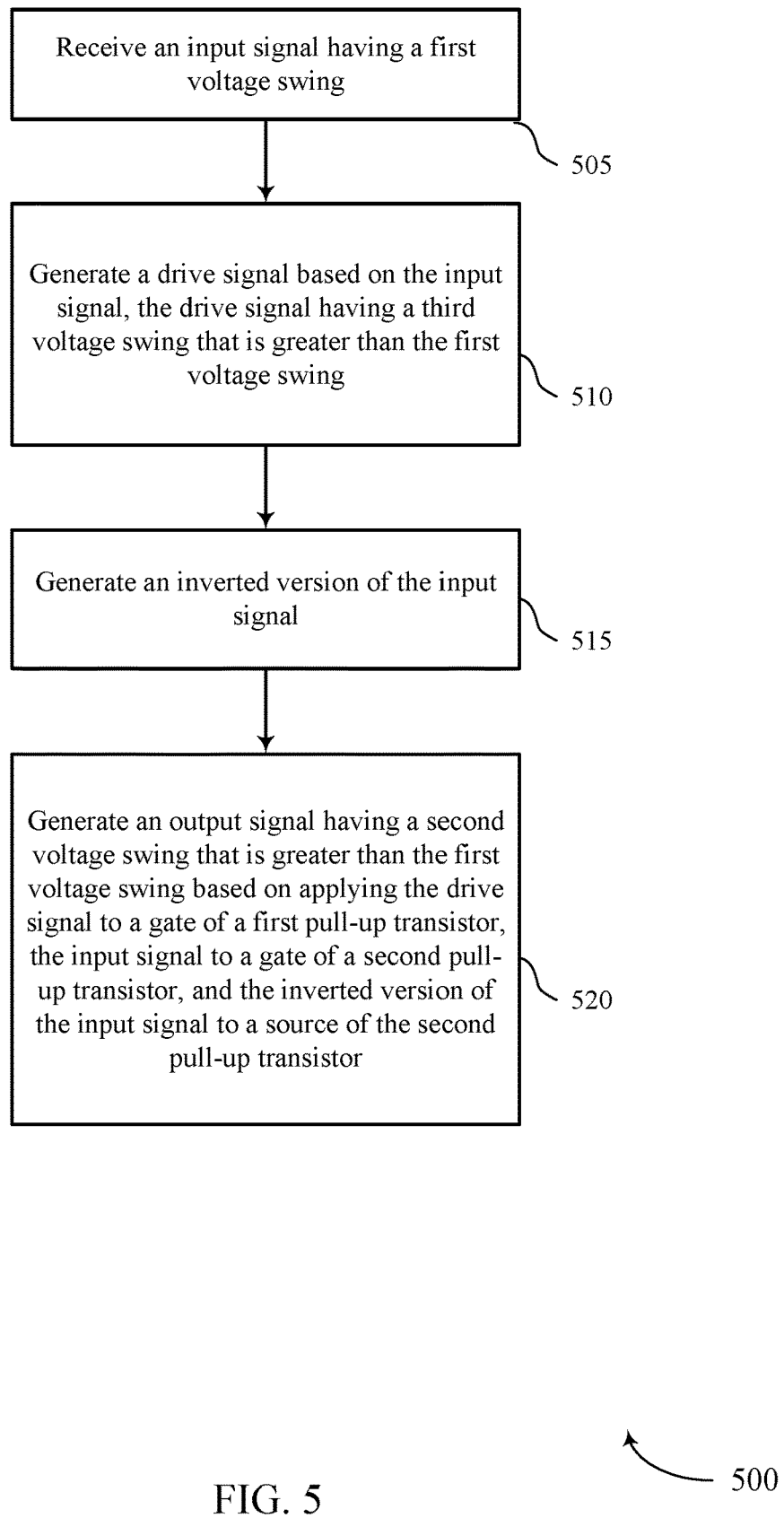

FIG. 5 shows a flowchart illustrating a method 500 for boosted high-speed level shifting in accordance with embodiments of the present disclosure. The operations of method 500 may be implemented by a level shifter 100 or its components as described herein. For example, the operations of method 500 may be performed by a level shifter as described with reference to FIG. 1.

At 505 the level shifter 100 may receive an input signal having a first voltage swing. The operations of 505 may be performed according to the methods described herein. In certain examples, aspects of the operations of 505 may be performed by a level shifter 100 as described with reference to FIG. 1.

At 510 the level shifter 100 may generate a drive signal based at least in part on the input signal, the drive signal having a third voltage swing that is greater than the first voltage swing. The operations of 510 may be performed according to the methods described herein. In certain examples, aspects of the operations of 510 may be performed by a level shifter 100 as described with reference to FIG. 1, including by a driver circuit 125 as described with reference to FIG. 1.

At 515 the level shifter 100 may generate an inverted version of the input signal. The operations of 520 may be performed according to the methods described herein. In certain examples, aspects of the operations of 520 may be performed by a level shifter 100 as described with reference to FIG. 1, including by a first inverter 130 as described with reference to FIG. 1.

At 520 the level shifter 100 may generate an output signal having a second voltage swing that is greater than the first voltage swing based at least in part on applying the drive signal to a gate of a first pull-up transistor, the input signal to a gate of a second pull-up transistor, and the inverted version of the input signal to a source of the second pull-up transistor. The operations of 520 may be performed by a level shifter 100 as described with reference to FIG. 1, including by a first inverter 130 as described with reference to FIG. 1.

Figure 6:
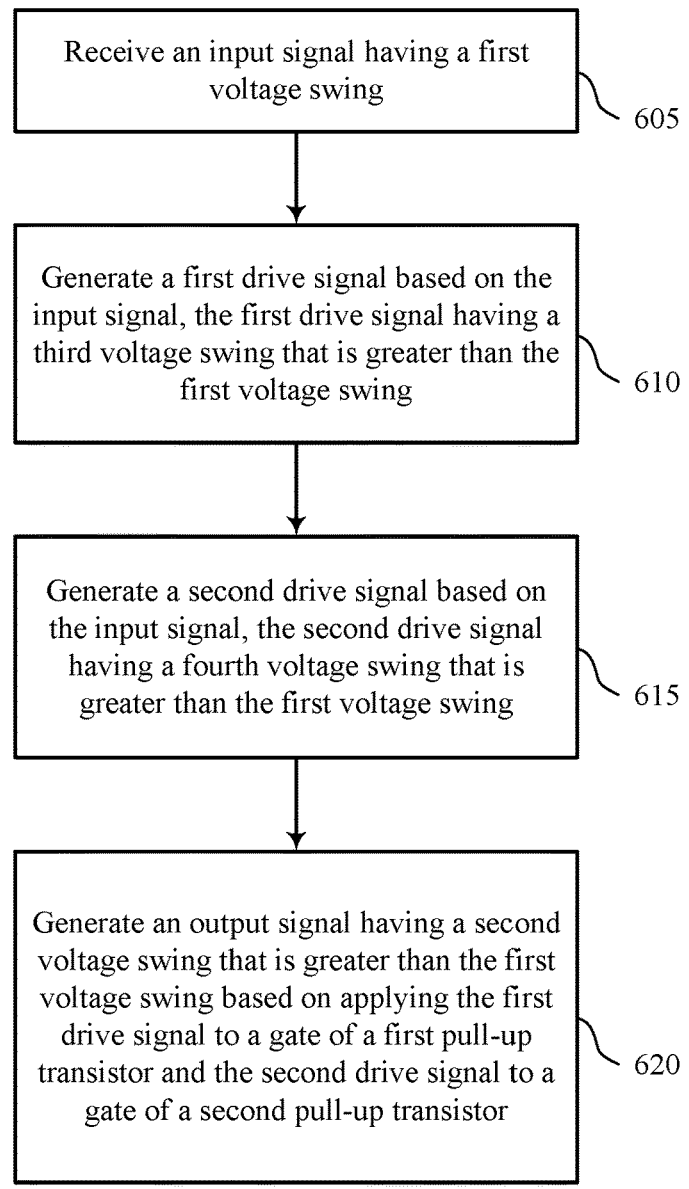

FIG. 6 shows a flowchart illustrating a method 600 for boosted high-speed level shifting in accordance with embodiments of the present disclosure. The operations of method 600 may be implemented by a level shifter 200 or its components as described herein. For example, the operations of method 600 may be performed by a level shifter as described with reference to FIG. 2.

In some cases, the method may also include—and an apparatus as described herein may include features, means, or instructions for—receiving an input signal having a first voltage swing, generating a first drive signal based at least in part on the input signal, the first drive signal having a third voltage swing that is greater than the first voltage swing, generating a second drive signal based at least in part on the input signal, the second drive signal having a fourth voltage swing that is greater than the first voltage swing, and generating an output signal having a second voltage swing that is greater than the first voltage swing based at least in part on applying the first drive signal to a gate of a first pull-up transistor and the second drive signal to a gate of a second pull-up transistor. In some cases, the third voltage swing may be equal in magnitude to the fourth voltage swing.

In some examples, the level shifter may perform aspects of the functions described below using special-purpose hardware. For example, the level shifter may be configured to convert an input signal having a first voltage swing into an output signal having a second voltage swing that is greater than the first voltage swing, and the level shifter may include a first driver circuit configured to generate a first drive signal based at least in part on the input signal, the first drive signal having a third voltage swing that is greater than the first voltage swing, a second driver circuit configured to generate a second drive signal based at least in part on the input signal, the second drive signal having a fourth voltage swing that is greater than the first voltage swing, a first pull-up transistor configured to drive the output signal when the input signal is in a first state, wherein the first drive signal drives a gate of the first pull-up transistor, and a second pull-up transistor configured to drive the output signal when the input signal is in a second state, wherein the second drive signal drives a gate of the second pull-up transistor.

At 605 the level shifter 200 may receive an input signal having a first voltage swing. The operations of 605 may be performed according to the methods described herein. In certain examples, aspects of the operations of 605 may be performed by a level shifter 200 as described with reference to FIG. 2.

At 610 the level shifter 200 may generate a first drive signal based at least in part on the input signal, the first drive signal having a third voltage swing that is greater than the first voltage swing. The operations of 610 may be performed according to the methods described herein. In certain examples, aspects of the operations of 610 may be performed by a level shifter 200 as described with reference to FIG. 2, including by a first driver circuit 125-*a* as described with reference to FIG. 2.

At 615 the level shifter 200 may generate a second drive signal based at least in part on the input signal, the second drive signal having a fourth voltage swing that is greater than the first voltage swing. The operations of 615 may be performed according to the methods described herein. In certain examples, aspects of the operations of 615 may be performed by a level shifter 200 as described with reference to FIG. 2, including by a second driver circuit 125-*b* as described with reference to FIG. 2.

At 620 the level shifter 100 may generate an output signal having a second voltage swing that is greater than the first voltage swing based at least in part on applying the first drive signal to a gate of a first pull-up transistor and the second drive signal to a gate of a second pull-up transistor. The operations of 620 may be performed according to the methods described herein. In certain examples, aspects of the operations of 620 may be performed by a level shifter 200 as described with reference to FIG. 2.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The devices discussed herein may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a level shifter configured to convert an input signal having a first voltage swing from a non-negative voltage to a positive voltage into an output signal having a second voltage swing that is greater than the first voltage swing, the level shifter comprising:
   a driver circuit configured to generate a drive signal based at least in part on the input signal, the drive signal having a third voltage swing that is greater than the first voltage swing, wherein the third voltage swing is from a negative voltage to the positive voltage; and
   a first pull-up transistor configured to drive the output signal when the input signal is in a first state, wherein the drive signal drives a gate of the first pull-up transistor; and
   a second pull-up transistor configured to drive the output signal when the input signal is in a second state, wherein the input signal drives a gate of the second pull-up transistor.

2. The apparatus of claim 1, further comprising:
   an inverter configured to generate an inverted version of the input signal and drive a source of the second pull-up transistor using the inverted version of the input signal.

3. The apparatus of claim 1, wherein the driver circuit comprises:
   a single pull-up transistor configured to couple the gate of the first pull-up transistor to a voltage source corresponding to an upper bound of the first voltage swing when the input signal is in the second state.

4. The apparatus of claim 3, wherein:
   a source of the single pull-up transistor is coupled with the voltage source corresponding to the upper bound of the first voltage swing; and
   a drain of the single pull-up transistor is coupled with the gate of the first pull-up transistor.

5. The apparatus of claim 3, wherein a drain of the single pull-up transistor is coupled with an n-type transistor.

6. The apparatus of claim 5, wherein the n-type transistor comprises a triple well transistor.

7. The apparatus of claim 3, wherein:
the single pull-up transistor has a first gate oxide thickness; and
at least one other transistor within the driver circuit has a second gate oxide thickness that is less than the first gate oxide thickness.

8. The apparatus of claim 1, wherein the driver circuit comprises:
a switching network configured to generate a voltage differential across a boost capacitor when the input signal is in the second state and couple the boost capacitor with the gate of the first pull-up transistor when the input signal is in the first state.

9. The apparatus of claim 8, wherein the voltage differential is based at least in part on the first voltage swing.

10. The apparatus of claim 8, wherein the switching network is further configured to couple the boost capacitor with a voltage source corresponding to a lower bound of the first voltage swing when the input signal is in the second state.

11. The apparatus of claim 8, wherein:
the boost capacitor comprises a transistor; and
a capacitance of the boost capacitor comprises a gate capacitance of the transistor.

12. The apparatus of claim 1, wherein:
being in the first state comprises having a voltage above a first threshold voltage; and
being in the second state comprises having a voltage below a second threshold voltage.

13. The apparatus of claim 12, wherein:
the first threshold voltage corresponds to a first logic value; and
the second threshold voltage corresponds to a second logic value.

14. The apparatus of claim 1, wherein:
the second voltage swing is from a negative voltage to the positive voltage.

15. A method, comprising:
receiving an input signal having a first voltage swing from a non-negative voltage to a positive voltage;
generating a drive signal based at least in part on the input signal, the drive signal having a third voltage swing that is greater than the first voltage swing, wherein the third voltage swing is from a negative voltage to the positive voltage; and
generating an output signal having a second voltage swing that is greater than the first voltage swing based at least in part on applying the drive signal to a gate of a first pull-up transistor and the input signal to a gate of a second pull-up transistor.

16. The method of claim 15, wherein generating the drive signal comprises:
coupling, when the input signal is in a second state, the gate of the first pull-up transistor to a voltage source corresponding to an upper bound of the first voltage swing via a single pull-up transistor.

17. The method of claim 15, wherein generating the drive signal comprises:
generating a voltage differential across a boost capacitor when the input signal is in a second state; and
coupling the boost capacitor with the gate of the first pull-up transistor when the input signal is in a first state.

18. The method of claim 15, further comprising:
generating an inverted version of the input signal;
applying the inverted version of the input signal to a source of the second pull-up transistor, wherein generating the output signal is based at least in part on applying the inverted version of the input signal to the source of the second pull-up transistor.

19. An apparatus, comprising:
a level shifter configured to receive an input signal having a first voltage range and generate an output signal having a second voltage range, wherein the first voltage range is from a non-negative lower bound to a positive upper bound and the second voltage range is from a negative lower bound to the positive upper bound, the level shifter comprising:
a first drive transistor configured to couple a gate of a first pull-up transistor with a boost capacitor when the input signal is in a first state, the first pull-up transistor configured to drive the output signal when the input signal is in the first state;
a second drive transistor configured to couple the gate of the first pull-up transistor to a voltage source corresponding to the positive upper bound when the input signal is in a second state, wherein the second drive transistor has a first sate oxide thickness and at least one other transistor within the level shifter has a second sate oxide thickness that is less than the first sate oxide thickness; and
a second pull-up transistor configured to drive the output signal when the input signal is in the second state, wherein the input signal drives a gate of the second pull-up transistor and an inverted version of the input signal drives a source of the second pull-up transistor.

* * * * *